United States Patent [19]

Schmitz et al.

[11] 3,930,909

[45] Jan. 6, 1976

[54] METHOD OF MANUFACTURING A SEMICONDUCTOR DEVICE UTILIZING SIMULTANEOUS OUTDIFFUSION DURING EPITAXIAL GROWTH

[75] Inventors: Albert Schmitz; Cornelis Mulder; Arie Slob, all of Eindhoven, Netherlands

[73] Assignee: U.S. Philips Corporation, New York, N.Y.

[22] Filed: Nov. 26, 1974

[21] Appl. No.: 527,236

Related U.S. Application Data

[60] Continuation of Ser. No. 31,435, April 13, 1970, abandoned, Division of Ser. No. 676,235, Oct. 18, 1967, Pat. No. 3,702,428.

[30] Foreign Application Priority Data

Oct. 21, 1966 Netherlands.................. 6614858

[52] U.S. Cl. ............... 148/175; 29/569; 29/576; 29/577; 148/190; 148/191; 357/40; 357/44; 357/48; 357/90

[51] Int. Cl.² ............... H01L 21/20; H01L 21/22; H01L 27/04

[58] Field of Search .......... 148/175, 187, 190, 191; 29/569, 576, 577; 357/40, 44, 48, 90

[56] References Cited
UNITED STATES PATENTS

| | | |
|---|---|---|
| 3,089,794 | 5/1963 | Marinace.................... 148/175 X |
| 3,260,624 | 6/1966 | Wiesner...................... 148/175 |
| 3,260,902 | 7/1966 | Porter........................ 148/175 X |
| 3,327,182 | 6/1967 | Kisinko...................... 357/48 X |
| 3,335,341 | 8/1967 | Lin............................ 357/48 X |
| 3,449,643 | 6/1969 | Imaizumi.................... 148/175 X |
| 3,474,308 | 10/1969 | Kronlage.................... 357/48 X |
| 3,481,801 | 12/1969 | Hugle........................ 148/175 |

*Primary Examiner*—C. Lovell
*Assistant Examiner*—W. G. Saba
*Attorney, Agent, or Firm*—Frank R. Trifari; Jack Oisher

[57] ABSTRACT

A method of making a semiconductor device is described in which opposite-type impurities are introduced into the same surface of a substrate in such manner that the region of impurities of the opposite-type to that of the substrate overlaps completely the other substrate surface region. Then an epitaxial layer is grown on the surface of the substrate. There is thus formed two buried layers of which the one with the same type conductivity of the substrate is completely separated and isolated from the latter by the buried layer of opposite-type conductivity. Methods are also described for the manufacture of complementary bipolar transistors, in which the pnp type is made by the above described method.

10 Claims, 8 Drawing Figures

METHOD OF MANUFACTURING A SEMICONDUCTOR DEVICE UTILIZING SIMULTANEOUS OUTDIFFUSION DURING EPITAXIAL GROWTH

CROSS REFERENCE

This application is a continuation of copending application, Ser. No. 31,435, now abondoned filed Apr. 13,1970 and a division of Ser. No. 676,235, filed Oct. 18, 1967 now U.S. Pat. No. 3,702,428.

This invention relates to a method of manufacturing a semiconductor device comprising a plurality of semiconductor circuit elements with a common semiconductor body use being made of a starting semiconductor body of the one conductivity type, the substrate, in which a pattern of surface regions of one conductivity type adjacent a surface of the substrate and having a concentration of impurities causing one conductivity type which is considerably higher than that of the substrate is formed by diffusion of an impurity and an epitaxial layer of the opposite conductivity type being formed on the said surface by deposition of semiconductor material. Afterwards an impurity causing one conductivity type is diffuused into surface portions of the epitaxial layer located above the pattern whereby at the same time diffusion from the pattern into the epitaxial layer occurs so that the impurity need be diffused into the epitaxial layer only through part of its thickness for the purpose of obtaining areas of the opposite conductivity type bounded in the epitaxial layer by diffused isolation regions of one conductivity type, these areas, islands, extending approximately throughout the thickness of the epitaxial layer. A region of one conductivity type is formed in at least one island diffusion of impurities and a region of the opposite conductivity type is formed in the said region for obtaining an npn(pnp) transistor in which these regions constitute the base region and the emitter region, respectively, and the surrounding area of the island constitutes the collector region.

It is often desirable to manufacture not only an npn(pnp)-transistor but also a complementary pnp(npn)-transistor. Several methods are known therefore in the semiconductor technique.

A first method is to form a surface region of one conductivity type in an island, this surface region thus forming the emitter region of a pnp(npn)-transistor in which the surrounding area of the island constitutes the base region and the regions of one conductivity type bounding the island, to which the substrate also belongs, constitute the collector region. Then the emitter region is made, for example, as thick as the base region of an npn(pnp)-transistor; the emitter and base regions can be formed simultaneously. The pnp(npn)-transistor can then be manufactured without an additional process step. However, an important disadvantage is that the base region of the pnp(npn)-transistor thus obtained is usually unduly thick, thus preventing satisfactory performance of the transistor. It is possible for the emitter region of the pnp(npn)-transistor to be diffused deeper into the island so that the base region becomes thinner, but in this case an additional process step is necessary and further the deep diffusion is time-consuming, difficult and poorly reproducible.

It has also been suggested to manufacture a lateral pnp(npn)-transistor, by forming in an island two surface regions of one conductivity type closely side by side. These surface regions serve as the emitter and the collector, respectively, while the base region can be thin by choosing a small distance between the surface regions. The regions may be formed simultaneously with the base region of an npn(pnp)-transistor. However, the geometry of an pnp(npn)-trannsistor thus obtained is very unfavourable and such transistors have, for example, a very low current-gain factor.

An object of the invention is to mitigate, at least considerably, the described disadvantages of known methods.

The present invention underlies recognition of the fact that a much better pnp(npn)-transistor can be obtained by using out-diffusion of an impurity from the substrate as well as from a surface of the epitaxial layer.

According to the invention, a method of the kind mentioned in the preamble is characterized in that a pattern is provided which includes a region above which an island is formed after the epitaxial layer has been applied, while during the isolation diffusion of the impurity causing one conductivity type for obtaining the isolated islands, the surface area of the epitaxial layer located above the said region of the pattern is masked against the in-diffusion, resulting in an island having a buried layer of one conductivity type which has been formed by diffusion from said region of the pattern, and that a surface region of one conductivity type is formed in this island above the buried layer by diffusion of an impurity for obtaining a pnp (npn)-trannsistor in which the said surface region is the emitter region and the surrounding area of the island is the base region, while the buried layer belongs to the collector region.

The base region of the npn(pnp)-transistor is preferably formed simultaneously with the emitter region of the pnp(npn)-transistor.

Since the buried layer belonging to the collector region of the pnp(npn)-transistor is obtained inter alia by out-diffusion of an impurity from the substrate into the epitaxial layer and the emitter region is formed by diffusion from the surface of the epitaxial layer, an intermediate thin base region may be obtained. It is not necessary to diffuse very deep, and for the manufacture of the pnp(npn)-transistor no additional process steps are necessary. Furthermore, the disadvantageous geometry above referred to, in which the emitter and collector regions are surface regions located side by side, is avoided.

Although the emitter region of the pnp(npn)-transistor may be formed after the isolation diffusion treatment for obtaining the islands, it is preferable to interrupt the isolation diffusion treatment for obtaining the islands and then to continue this treatment while forming simultaneously the emitter region of the pnp(npn)-transistor by diffusion of an impurity causing one conductivity type. The last-mentioned method provides a time gain and furthermore, for example, the thickness of the base region beneath the emitter region of the pnp(npn)-transistor can be adjusted more accurately and in a more reproducible manner since the formation of the emitter region does not affect the thickness of the buried layer of one conductivity type. If the emitter region is formed after the isolation diffusion treatment for obtaining the island, the thickness of the buried layer of one conductivity type, and hence the thickness of the base region beneath the emitter region, is determined not only by the isolation diffusion treatment, but also by the diffusion treatment for obtaining the emitter region and this may introduce inaccuracies.

The buried layer and the substrate have the same conductivity type and together form one region of one conductivity type. This implies that, when used in a circuit, the potential applied to the collector region of the pnp(npn)-transistor can only be the same as that applied to the substrate. This is not troublesome for several uses. However, for other uses it is desirable that the potential applied to the collector region of the pnp(npn)-transistor be different from that applied to the substrate.

Consequently an important preferred embodiment of the method according to the invention is characterized in that a pattern is provided in the substrate in which the said region of the patttern is separated from the remaining part of the pattern, and prior to the formation of the epitaxial layer an impurity causing the opposite conductivity type is diffused into a surface region of the substrate which surface region, when viewed on the surface of the substrate, overlaps said region of the pattern on all sides. The last-named impurity has a diffusion coefficient which is lower than that of the impurity with which the pattern is formed and also a concentration with which, after the formation of the epitaxial layer and after the isolation diffusion treatment for obtaining the islands, a second buried layer but of the opposite conductivity type is obtained which includes the overlapping surface region and which separates the buried layer of one conductivity type located in the epitaxial layer from the underlying part of one conductivity type belonging to the substrate, and above the buried layer of one conductivity type there is formed, in addition to the emitter region, a second surface region of one conductivity type, the contact region, which extends to the buried layer of one conductivity type. The buried layer of one conductivity type which belongs to the collector region is now separated from the substrate by regions of the other conductivity type and may thus have applied to it a potential other than that of the substrate.

Another important embodiment of the method according to the invention whereby a structure is obtained in which a potential may be applied to the collector region othe than that of the substrate and in which, furthermore, a collector region of the pnp(npn)-transistor is obtained which is thicker and of higher electric conductivity is characterized in that a pattern is provided in the substrate in which the said region of the pattern is separated from the remaining part of the pattern, and prior to the formation of the epitaxial layer, an impurity causing the opposite conductivity type is diffused into a surface region of the substrate, which surface region, when viewed on the surface of the substrate, overlaps said region of the pattern on all sides, said impurity having a concentration which is greater than that of the impurity in the substrate determining the conductivity type and which is lower than that of the impurity with which the pattern is formed. During the diffusion treatments of the method the impurity causing the opposite conductivity type is diffused deeper into the substrate than that with which the pattern is formed, resulting in a buried layer of one conductivity type which includes said region of the pattern and which is wholly surrounded in the substrate by a second buried layer of the opposite conductivity type, and above the buried layer of one conductivity type there is formed, in addition to the emitter region, a second surface region of one conductivity type, the contact region, which extends to the buried layer of one conductivity type.

This method differs from the previously mentioned method in that the buried layer of the resulting structure which belongs to the collector region of the pnp(npn)-transistor extends over part of its thickness into the substrate.

The impurity causing the opposite conductivity type preferably has a diffusion coefficient which is greater than that of the impurity with which the pattern is formed so that the impurity causing the opposite conductivty type may readily be diffused deeper in the substrate than the impurity causing one conductivity type.

Furthermore, prior to the formation of the epitaxial layer, the impurity causing the opposite conductivity type may be diffused deeper into the substrate than that with which the pattern is formed, it then being unnecessary for the diffusion coefficient of the impurity causing the opposite conductivity type to be greater than that of the impurity with which the pattern is formed.

The contact region which extends to the buried layer of one conductivity type preferably surrounds the emitter region of one conductivity type so that the second buried layer of the opposite conductivity type is separated from the base region of the pnp(npn)-transistor. This makes it possible to apply a potential to the buried layer of the opposite conductivity type which reduces the possibility of a parasitic transsitor action between the collector region of the pnp(npn)-transistor and the substrate.

The contact region is preferably formed during the isolation diffusion treatment for obtaining the islands, so that the formation of the contact region does not require an additional process step.

Preferably a buried layer of the opposite conductivity type is provided for reducing the collector series-resistance of the npn(pnp)-transistor in a region adjacent the junction between the island in which the npn(pnp)-transistor is formed and the substrate. The buried layers of the opposite conductivity type which are formed for the pnp(npn)-transistor and the npn(pnp)-transistor are advantageously formed simultaneously so that additional process steps are avoided.

The method according to the invention thus makes it possible to manufacture both npn(pnp)-transistors and pnp(npn)-transistors having a buried layer belonging to the collector region and in which no additional process steps are necessary for manufacturing the pnp(npn)-transistor.

Use is preferably made of a p-type silicon substrate on which an n-type epitaxial silicon layer is formed, since with the present state of the semiconductor art this has has advantages from a technical view point, while final products are obtainable which are better and especially more stable than in the case where an n-type silicon substrate with a p-type epitaxial layer is used.

The invention also relates to a semiconductor device comprising a npn(pnp)-transistor and a pnp(npn)-transistor with a common semiconductor body as manufactured by the use of a method according to the invention.

In order that the invention may be readily carried into effect, it will now be described in detail, by way of example, with reference to the accompanying diagrammatic drawings, in which.

Similar parts are indicated in the figures by the same reference numerals.

Figure 1:
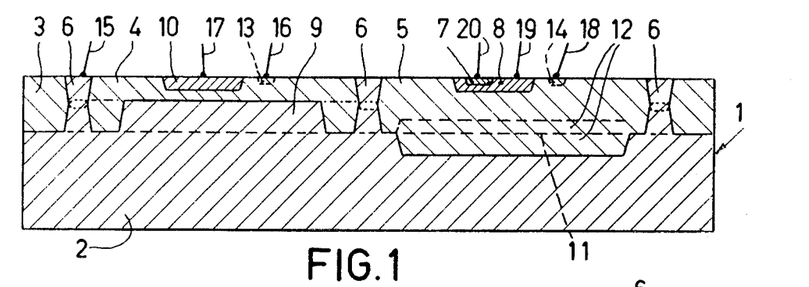
FIG. 1 is a cross-sectional view of a first embodiment of a semiconductor device according to the invention, taken on the line I—I of FIG. 2.
Figure 2:
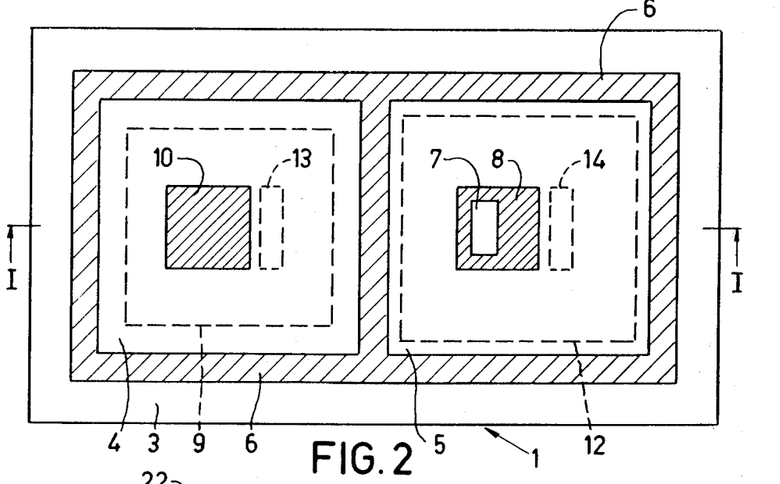
FIG. 2 is a plan view on this device.

FIGS. 1 and 2 show one embodiment of a semiconductor device according to the invention having a semiconductor body 1 comprising a substrate 2 with p-type conductivity and provided thereon an epitaxial layer 3 which includes a plurality of areas, islands, 4 and 5 of n-type cnductivity which are bounded by isolation regions 6 of p-type conductivity which adjoin the substrate 2. The island 5 comprises an npn-transistor in which the emitter region is formed by a diffused n-type surface region 7, the base region is formed by a diffused p-type region 8 surrounding the emitter region in the island 5, and the collector region is formed by n-type area of the island 5 surrounding the base region 8.

According to the invention, the island 4 includes a buried p-type layer 9, that is to say a layer 9 which lies deep in the island (that is to say a layer which lies deep in the epitaxial layer 3 and which can partly lie in the substrate 2) and which does not appear at the surface of the island 4. The buried layer 9 belongs to the collector region of the pnp-type transistor in which a diffused p-type surface region 10 formed above the buried layer 9 is the emitter region and in which the n-type area of the island 4 located between the region 10 and the layer 9, that is to say the area which does not belong to the region 10 and the layer 9, is the base region.

In the present embodiment, in order to reduce the collector series-resistance of the npn-transistor, a buried n-type layer 12 is formed in a region encompassing the junction 11 between the island 5, in which the npn-transistor is formed, and the substrate 2. The buried layer 12 makes the collector region of the npn-transistor thicker and may also have a higher concentration of n-type impurities than the island 5.

N-type regions 13 and 14 which have a concentration of n-type impurities which is higher than that of the islands 4 and 5 are formed to obtain good electrical connections. The electrical connections 15 to 20 are shown very diagrammatically in FIG. 1 only, lest the figures are made unnecessarily complicated. For the same reasons the insulating layer, for example of silicon oxide or silicon nitride, which is usually present and applied to the epitaxial layer 3 is omitted in the figures. Such an insulating layer has apertures through which the electrical connections 15 to 20 are made to the semiconductor body 1, the electrical connections possibly extending over the insulating layer in the form of metal tracks. With the insulating layer present, the junction fored by the surface diffused regions extend to the surface under the insulating layer as is common in the planar process.

The semiconductor device of FIGS. 1 and 2 comprising an npn-transistor and a pnp-transistor and a common semiconductor body 1 may be manufactured by a method according to the invention as follows:

Use is made of a p-type substrate 2 approximately 250 $\mu$ thick having a resistivity of approximately 5 $\Omega$cm. The further dimensions are unimportant and must merely be large enough to permit the formation of two islands of the dimensions specified hereinafter.

A pattern 22 (see also FIGS. 3 and 4) adjacent to a surface 21 is formed in the substrate 2 by diffusion of boron (p-type). The pattern 22 comprises p-type surface regions having a concentration of p-type impurities which is materially greater, that is to say 10 times greater and in practice from 100 to 1000 times greater, than that of the substrate 2.

Figure 3:
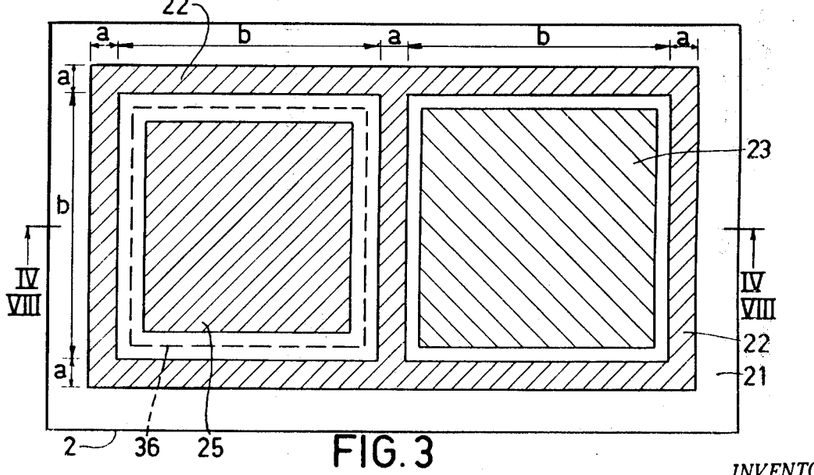
FIG. 3 is a plan view of a stage during the manufacture of the device by the method according to the invention.
Figure 4:
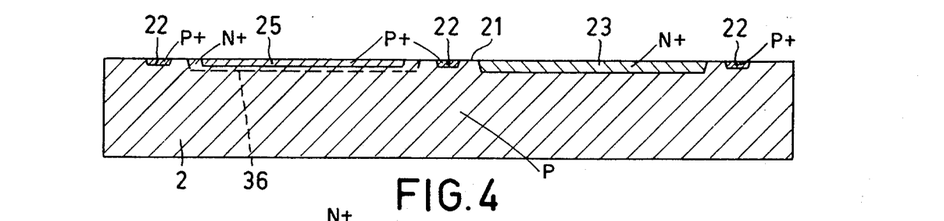
FIG. 4 is a cross-sectional view of the stage, taken on the line IV—IV of FIG. 3.

The boron may be diffused in a conventional manner using, for example, a silicon-oxide layer provided with apertures as a diffusion mask. The surface concentration of boron in the pattern 22 is approimately $5 \times 10^{19}$ boron atoms/ccm and the pattern 22 is between approximately 0.5 $\mu$ and 1 $\mu$ thick. The dimensions $a$ and $b$ indicated in FIG. 3 are approximately 25 $\mu$ and 200 $\mu$ respectively.

To decrease the collector series-resistance of the npn-type transistor (see FIGS. 1 and 2) it is necessary to form an n-type buried layer 12 in the region of the junction 11 between the island 5, in which the npn-transistor is manufactured, and the substrate 2. To this end, an n-type surface region 23 is formed, in addition to the pattern 22, in the substrate 2 (see FIGS. 3 and 4). The surface region 23 has dimensions of, for example, 150 $\mu \times$ 150 $\mu \times$ 5 $\mu$ and may be obtained by diffusing arsenic (n-type) into the substrate 2 in a conventional manner. The surface concentration of the arsenic is approximately $21 \times 10^{20}$ arsenic atoms/ccm. During the diffusion of the arsenic the boron diffuses deeper into the substrate 2, so that the pattern 22 becomes thicker and even thicker than the region 23.

Subsequently the surface 21 of the substrate 2 is covered with an epitaxial n-type layer 3, (see also FIGS. 1 and 2) having a thickness of approximately 10 $\mu$ and a resistivity of approximately 0.3$\Omega$cm. This may be carried out in a conventional manner, for example, by depositing silicon from a gaseous compound.

Boron (p-type) is diffused into surface areas of the epitaxial layer 3 located above the patters 22. During this process boron is also out-diffused from the pattern 22 into the epitaxial layer 3. Consequently the boron need be diffused into the epitaxial layer through only half its thickness, approximately 5 $\mu$, to obtain the n-type islands 4 and 5 which are bounded by the isolation p-type regions 6 obtained by the diffusion of boron. The islands 4 and 5 extend substantially over half the thickness of the epitaxial layer 3. The diffusion of boron may be effected in a conventional manner.

During the diffusion of the boron, aresenic is also out-diffused from the zone 23. The arsenic penetrates the epitaxial layer 3 over a depth of approximately 1.5 $\mu$, resulting in the n-type buried layer 12 being obtained.

The p-type regin 8 having dimensions of approximately 40 $\mu$ × 40 $\mu$ × 2 $\mu$ and a surface concentration between approximately $10^{18}$ and $10^{19}$ boron atoms/ccm is formed in the island 5 by diffusion of boron. The n-type region 7 is formed in the region 8 by diffusion of phosphorus. The region 7 has dimensions of approximately 15 $\mu$ × 30 $\mu$ × 1 $\mu$ and a surface concentration higher than $10^{20}$ phosphorous atoms/ccm. The diffusions of boron and phosphorus may be effected in a conventional manner. The region 7 is the emitter region, the region 8 is the base region and the adjacent area of the island 5 including the buried layer 12 is the collector region of the npn-transistor.

According to the invention a pnp-transistor having a buried p-type layer 9 is also formed preferably simultaneously with the manufacture of the npn-transistor previously described.

To this end, a pattern 22, 25 is provided in the substrate 2 (see FIGS. 3 and 4) having an area 25 of approximately 100 $\mu$ × 100 $\mu$ × 0.5 $\mu$ to 1 $\mu$, above which the island 4 is formed following the formation of the epitaxial layer 3, and the surface area of the epitaxial layer 3 located above the area 25 of the pattern 22, 25 is masked during the diffusion of boron for obtaining the isolation regions 6 and hence the islands 4 and 5, resulting in the island 4 obtained with a p-type buried layer 9 which has been formed by out-diffusion of boron from the area 25. Subsequently the p-type surface region 10 is formed in the island 4 above the buried layer 9. This may be effected at the same time as the region 8 is formed; the regions 10 and 8 may have have the same dimensions. The p-type region 10 is the emitter region of the pnp-transistor, the surrounding n-type area of the island 4 is the base region, while the p-type buried layer 9 belongs to the collector region. Although, as previously described, the p-type emitter region 10 and the p-type base region 8 may be formed after the isolation diffusion treatment for obtaining the islands 4 and 5, and hence the regions 6, it is preferable to interrupt the isolation diffusion treatment for obtaining the islands 4 and 5 and then to continue this treatment while forming at the same time the emitter region 10 and the base region 8 by diffusion of a p-type impurity.

A diffusion treatment for obtaining islands in an epitaxial layer is carried out with the use of a diffusion mask provided on the epitaxial layer. The diffusion mask often consists of an apertured silicon oxide layer (or silicon nitride layer), an impurity being diffused through the apertures into the epitaxial layer.

In the described method according to the invention, an apertured mask may be provided on the epitaxial layer 3 in a conventional manner, boron being diffused through the apertures in the epitaxial layer 3 to obtain the regions 6. To this end, the boron is previously provided in the apertures, for example, in the form of boron oxide. It is now possible to interrupt the diffusion treatment before the regions 6 resulting also from diffusion from the pattern 22 have been formed completely and to form apertures in the diffusion mask for forming the regions 8 and 10. After boron oxide has been provided in these apertures as well, the diffusion treatment is continued whereby the regions 6 acquire their ultimate shape and at the same time the regions 8 and 10 are obtained.

The advantage then occurs that the thickness of the buried layer 9 does not depend upon the diffusion treatment for obtaining the regions 8 and 10, as is the case if the regions 8 and 10 are formed after the isolation diffusion treatment for obtaining the islands 4 and 5 and the regions 6. An unduly great thickness of the buried layer 9 can thus be prevented and the thickness of the base region between the emitter region 10 and the buried layer 9 can be adjusted more accurately.

The area 25 is formed in a similar manner as the regions 22. The buried layer 9 penetrates the epitaxial layer 3 through a depth of approximately 5 $\mu$ (half the thickness of the epitaxial layer 3).

The diffusion from the pattern 22, 25 into the substrate 2 is not shown in FIGS. 1–3 since this diffusion is not interesting for the operation nor for the device to be obtained.

The isolation regions 6 consist of regions which overlap one another. This overlapping is indicated in broken lines in the regions 6.

The n-type regions 13 and 14 can be formed at the same time and in a similar manner as the emitter region 7 and have dimensions of approximately 10 $\mu$ × 40 $\mu$ × 1 $\mu$.

The electrical connections 15 to 20 may be made in a conventional manner. The lower side of the substrate 2 may also be provided with an electrical connection which may serve as a collector connection of the pnp-transistor. The connection 15 may then be dispensed with.

The electrical connections 15, 16, 17 and 18, 19, 20 form the collector, base and emitter connections of the pnp-transistor and the npn-transistor respectively.

The buried p-type layer 9 may have a larger surface area and adjoin the regions 6 locally or round about. The last-mentioned possibility is indicated by dot-and-dash lines in FIG. 1.

Since the buried layer 9 belonging to the collector region is obtained by out diffusion from the substrate 2 and the emitter region 10 is obtained by in diffusion from the surface of the epitaxial layer 3, a thin base region for the pnp-transistor is possible while avoiding very deep diffusion and furthermore for obtaining the pnp-transistor no additional process steps are necessary relative to the npn-transistor.

Figure 5:
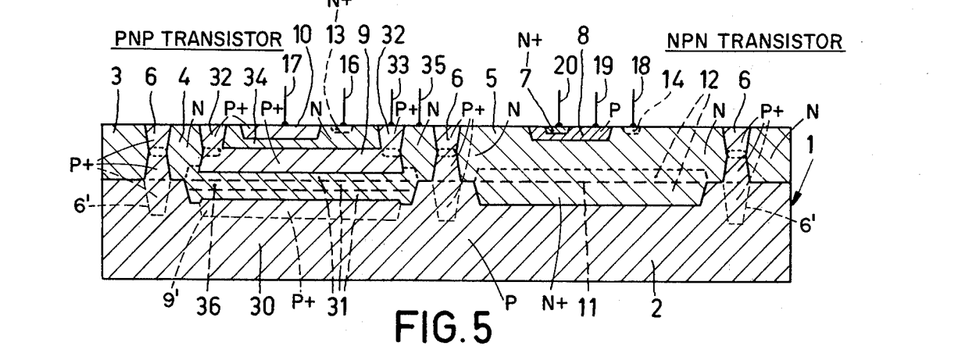
FIG. 5 is a cross-sectional view of a second embodiment of a semiconductor device according to the invention, taken on the line V—V of FIG. 6.
Figure 6:
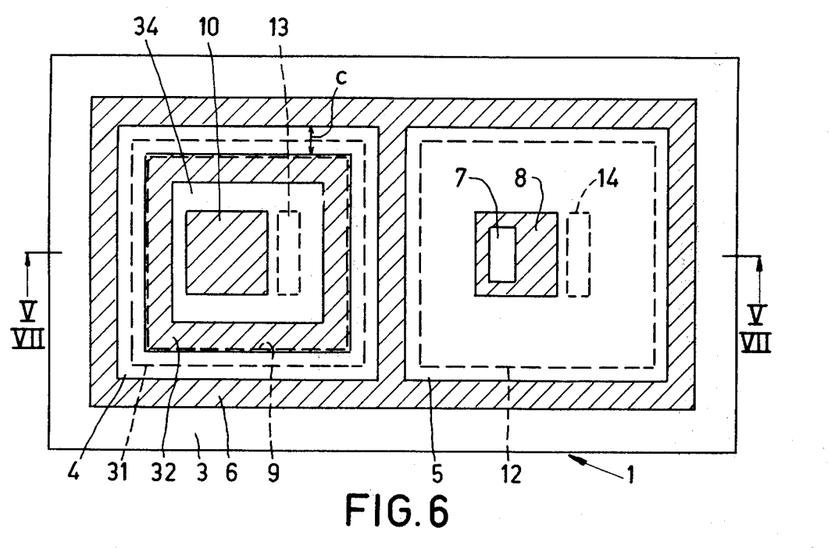
FIG. 6 is a plan view on the second embodiment which during its manufacture passes through a stage which is also shown in FIGS. 3 and 4.

FIGS. 5 and 6 show a semiconductor device according to the invention of a similar kind to that of the previous figures, but in which the p-type buried layer 9 is separated from the underlying p-type area 30 belonging to the substrate 2, by means of a second buried n-type layer 31, and a p-type surface region, a contact region 32, is present above the p-type buried layer 9, and which extends to the layer 9. The region 32 and the layer 9 slightly overlap each other as indicated in broken lines.

The second buried n-type layer 31 makes it possible for the collector region 9, 32 of the pnp-transistor to have applied it to a potential which differs from that applied to the substrate 2. The contact region 32 is provided with an electrical connection 33.

The contact region 32 surrounds the p-type emitter region 10 completely, so that the second buried layer 31 does not form part of the n-type base region 34.

It is thus possible to apply a potential to the second buried n-type layer 31 via an electrical connection 35 irrespectively of the potential applied to the base region, the possibility of parasitic operation of the transistor between the p-type layer 9 and the substrate 2 thus being avoided or limited.

The device shown in FIGS. 5 and 6 may be manufactured in a similar manner, except for some minor modifications, as the previous embodiment.

It is necessary to provide a pattern 22, 25 (see also FIGS. 3 and 4) in which the area 25 is separated from the remaining part 22 of the pattern. Further, prior to the formation of the epitaxial layer 3, arsenic (n-type) is diffused into a surface region 36. When viewed on the surface 21 of the substrate 2 (see FIG. 3) the region 36 overlaps the area 25 on all sides. The regions 36 and 23 may be formed simultaneously and in the same manner and may have the same dimensions. The concentration of arsenic in the regions 36 and 23 is greater than that of the impurity which causes p-type conductivity in the substrate 2. Arsenic diffuses into silicon more slowly than boron with which the pattern 22, 25 has been formed, and the concentration of arsenic in the overlapping region 36 is high enough, so that after the formation of the epitaxial layer 3 and after the isolation diffusion treatment for obtaining the islands, a second buried n-type layer 31 is formed which includes the overlapping surface region 36 and which separates the buried p-type layer 9 located in the epitaxial layer 3, from the underlying p-type area 30 which belongs to the substrate 2.

The p-type contact region 32 may be obtained by diffusion of boron simultaneously with the formation of the regions 6 and has a width C of, for example, approximately 10 $\mu$.

Figure 7:
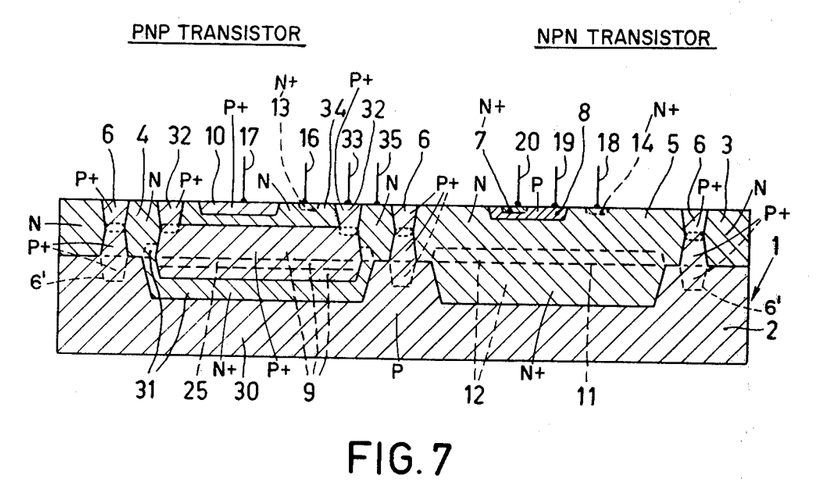
FIG. 7 is a cross-sectional view of a third embodiment of a semiconductor device according to the invention, the plan view of which is similar to that shown in FIG. 6, the cross-sectinal view being taken on the line VII—VII (coincident) with the line V—V) of FIG. 6.

FIG. 7 is a cross-sectional view of a semiconductor device of a similar kind to the previous embodiment and with the same plan view (see FIG. 6), but in which the second buried layer 31 of the opposite conductivity type lies in the substrate 2 substantially throughout its thickness. This permits a thicker buried layer 9 of one conductivity type and hence a thicker collector region of the pnp-transistor and a lower collector series-resistance. The latter point is an important advantage with respect to the previous embodiment.

Figure 8:
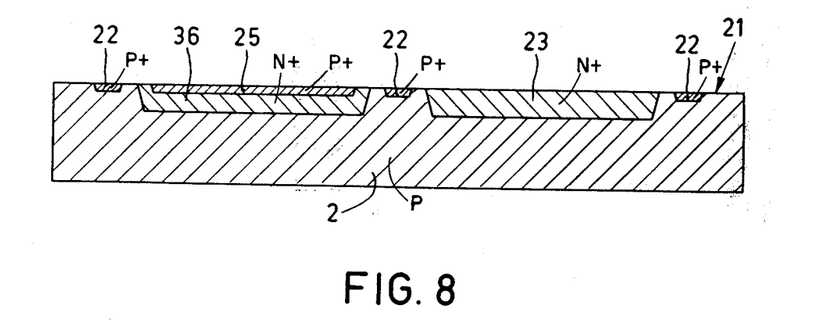
FIG. 8 is a cross-sectional view of a stage of the third embodiment during its manufacture by a method according to the invention, the plan view of which stage is similar to that of FIG. 3, the cross-section being taken on the line VIII—VIII (coincident with the line IV—IV) of FIG. 3.

The manufacture proceeds in a similar manner as with the previous embodiment. It is again necessary to provide a pattern 22, 25 in the substrate 2 (see FIGS. 8 and 3) with the area 25 separated from the remaining part 22 of the pattern. Further an n-type impurity is again provided in a region 23 and in a region 36 which in plan view overlaps the area 25 (FIG. 3). The concentration of the n-type impurity is greater than that of the impurity determining the conductivity type in the substrate 2 and lower than that of the impurity with which the pattern 22, 25 is formed.

During the diffusion treatments of the method, the n-type impurity is diffused deeper into the substrate 2 than that with which the pattern 22, 25 is formed. This results in a p-type buried layer 9 which includes the area 25 and is completely surrounded by the second buried n-type layer 31 in the substrate 2. A surface region, the contact region 32, which extends to the layer 9 is again formed around the emitter region 10.

The sole difference from the method described with the previous embodiment relates to the formation of the pattern 22, 25 and the regions 23 and 36 in the substrate 2.

The n-type impurity, for example phosphorus, for obtaining the regions 23 and 36 may advantageously have a diffusion coefficeint greater than that of the impurity, for example boron, with which the pattern 22, 25 is formed. Further, prior to the formation of the epitaxial layer 3, the n-type impurity may already be diffused into the substrate 2 to a considerably greater depth than the p-type impurity.

The regions 23 and 36, for example, are first formed in the substrate by diffusing phosphorus into the substrate 2 in a conventional manner. The regiong 23 and 36 are approximately 10 $\mu$ thick and have a surface concentration of approximately $10^{18}$ phosphorus atoms/ccm. Then the pattern 22, 25 is provided by diffusing boron into the substrate in a conventional manner. The pattern 22, 25 is approximately 2 $\mu$ thick and has a surface concentration of approximately $10^{20}$ boron atoms/ccm.

The method otherwise proceeds in a similar manner as with the previous embodiments, the phosphorus diffusing from the regions 23 and 36 into the epitaxial layer through approximately 2.5 $\mu$, that is to say that the n-type impurity concentration in the islands 4 and 5 noticeably increases over a distance of approximately 2.5 $\mu$.

For completeness' sake, in FIGS. 5 and 7 are also shown in dashed lines the impurity diffusion into the substrate from regions 22 and 26. Thus p regions 6' are formed under the pattern 22, and P region 9' under region 25 in FIG. 5. The latter forms because boron diffuses faster than the arsenic, and regions 25 and 36 in FIG. 4 have approximately the same depth. In FIG. 7, however, no p region is formed under the n region 31 because phosphorus has a higher diffusion constant and region 36 is much deeper than region 25. However, as will be observed these acceptor diffusions into the substrate are unimportant because the substrate is also P type.

It will be evident that, although embodiments have been described in which only one pnp-transistor and only one npn-transistor are formed in a semiconductor body, it is possible to manufacture a plurality of npn-transistors and/or a plurality of pnp-transistors in a semiconductor body and furthermore several other circuit elements, such as diodes, capacitors and resistors.

The use of npn-transistors together with pnp-transistors is integrated semiconductor circuits has hitherto been avoided in the semiconductor technique as far as possible, since it was very difficult to manufacture both types of transistors with good quality in one semiconductor body. The invention makes it possible in a simple manner to manufacture both types of transistors in a semiconductor body with reasonable qualities, thus considerably widening the possibilities for use of integrated semiconductor circuits.

It will be evident that the invention is not confined to the embodiments described and that numerous variations are possible to a man skilled in the art without passing beyond the scope of the invention.

Furthermore an npn-transistor and an pnp-transistor according to the invention may be combined in one island. See for instance FIG. 1 in which the base-zone 8 of the npn-transistor may also consititute the emitter zone 10 of the pnp-transistor, in case the buried layer 12 is reduced to about half its size and only lies beneath about the half of the base-zone 8 in which the emitter zone 7 is provided and the buried layer 9 is also reduced to about half its size and lies beside the buried layer 12 beneath the other half of the base zone 8. Preferably the collector connection 14, 18 and the base connection 19 lie above the buried layers 12 and 9 respectively. The result is a npn-transistor with an improved parasitio parasitic which increases the switching speed of the npn-transistor by reducing the storage time. This is claimed in a copending application, now U.S. Pat. No. 3,586,931.

Thus it is possible, for example, to form more than one semiconductor circuit element in an island. Further, the islands 4 and 5 of FIGS. 1, 2, 5, 6 and 7 need not have a common isolation boundary region 6. The two islands can be surrounded in the epitaxial layer by separate boundary regions 6. It is not always necessary for the contact region 32 to surround the emitter region 10 completely (see FIGS. 1, 2, 6 and 7). Further, a large number of semiconductor devices according to the invention can be manufactured simultaneously in one semiconductor disc which, after using a method according to the invention, may be subdivided into individual semiconductor devices. It is also possible to use semiconductor materials and/or impurities other than those described. The emitter region 10 and the base region 8 need not be formed simultaneously. If, for example, an impurity concentration greater for region 10 than for region 8 is desired, these regions may be manufactured one after the other.

What is claimed is:

1. A method of making a semiconductor device comprising the steps of providing a semiconductor body having a substrate portion of one conductivity type and having a surface, introducing in a first limited area surface region of the substrate portion and at said surface one-type forming impurities, introducing in a second surface region of the said substrate portion and at said surface opposite-type forming impurities, said second surface region completely overlapping said first surface region, growing an epitaxial layer of the opposite conductivity type on the said surface containing the first and second surface regions, the impurity concentrations in and the depth of said first and second surface regions and the relative diffusion coefficients of the impurities having values such that upon the application of heat the said one-type forming impurities form a first buried layer of one conductivity type, and the said opposite-type forming impurities form a second buried layer of the opposite conductivity type which completely separates the first buried layer from underlying substrate parts of one conductivity type, and forming in the epitaxial layer portion overlying the first buried layer at least part of the semiconductor circuit element.

2. A method as claimed in claim 1, wherein said body is heated until said first buried layer is extended into the epitaxial layer by out-diffusion of one-type forming impurities from said first surface region, the introduced opposite-type forming impurities having a diffusion coefficient lower than that of the one-type forming impurities and being provided in such a high concentration that the said second surface region is of the opposite-type conductivity and forms part of the second buried layer of opposite conductivity type.

3. A method as claimed in claim 1, wherein the opposite-type forming impurities are introduced in said second surface region in a concentration higher than that of the impurities in said substrate portion determining the one conductivity type of the substrate portion, but lower than that of the one-type forming impurities in said first surface region, and such that the second surface region extends to a greater depth into the substrate than that of the first surface region, whereby the first surface region is of one conductivity type surrounded by a part of the second surface region of the opposite conductivity part, said first surface region after provision of the epitaxial layer remaining part of the first one-type buried layer.

4. A method as claimed in claim 1, wherein the opposite-type forming impurities have a diffusion coefficient higher than that of the one-type forming impurities and a concentration lower than that of the one-type forming impurities such that the first surface region is of one-type conductivity, and heating the body such that after provision of the epitaxial layer the first surface region remains part of the first buried layer of one conductivity type and the second buried layer of opposite conductivity type at least partly is obtained by diffusion of opposite-type forming impurities from the second surface region deeper into the substrate portion.

5. A method as set forth in claim 1, wherein following growth of the epitaxial layer one-type impurities are diffused into the epitaxial layer surface in a position overlying a portion of the first buried layer until they reach the latter forming a surface contact region connected to the first buried layer.

6. A method as set forth in claim 5, wherein the one-type impurities are diffused into the epitaxial layer surface in an annular pattern overlying peripheral portions of the first buried layer to form a first one-type tub-shaped region enclosing at least part of the circuit element.

7. A method as set forth in claim 6, and further including a step of forming by introducing impurities into the epitaxial layer an annular region of one-type conductivity laterally surrounding and spaced from the first tub-shaped region and extending from the epitaxial layer surface through the epitaxial layer into substrate parts of one-type conductivity to form isolation walls surrounding the tub-shaped region.

8. A method as set forth in claim 1, wherein the second substrate surface region also has a limited area less than the whole substrate surface.

9. A method of making a semiconductor device comprising the steps of providing a semiconductor monocrystal having a substrate portion of one conductivity type and having a surface, forming in the substrate portion at said surface a first limited area surface region containing one-type forming impurities, forming in the substrate portion at said surface a second surface region containing opposite-type impurities, said second substrate surface region completely overlapping the first substrate surface region and extending deeper into the substrate than the latter and separating the first limited surface region from substrate parts of one conductivity type underneath said first region, thereafter growing a single epitaxial layer of the opposite conductivity type containing impurities in a uniform concentration lower than that present in the first and second surface regions on the substrate surface containing the first and second surface regions, said opposite-type impurities in the second substrate surface region having a diffusion coefficient lower than that of the one-type impurities in the first substrate surface region but being present in the substrate in a concentration exceeding that of the one-type impurities, applying heat to the assembly until there is formed in the epitaxial layer by out-diffusion of one-type forming impurities from the first substrate surface region a first buried layer of one-type conductivity but which remains spaced from the surface of the epitaxial layer and is separated by the second substrate surface region from underlying substrate parts of one conductivity type, and forming in the epitaxial layer portion overlying the first buried layer at least part of a semiconductor circuit element.

10. A method as set forth in claim 9, wherein following growth of the epitaxial layer one-type impurities are diffused into the epitaxial layer surface in a position overlying a portion of the first buried layer until they reach the latter forming a surface contact region connected to the first buried layer.

\* \* \* \* \*